(12) United States Patent
Kawakami

(10) Patent No.: US 11,398,601 B2
(45) Date of Patent: Jul. 26, 2022

(54) PATTERN FORMING METHOD, METHOD FOR PRODUCING TRANSISTOR, AND MEMBER FOR PATTERN FORMATION

(71) Applicant: NIKON CORPORATION, Tokyo (JP)

(72) Inventor: Yusuke Kawakami, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 288 days.

(21) Appl. No.: 16/897,728

(22) Filed: Jun. 10, 2020

(65) Prior Publication Data

US 2020/0303650 A1 Sep. 24, 2020

Related U.S. Application Data

(63) Continuation of application No. PCT/JP2018/045417, filed on Dec. 11, 2018.

(30) Foreign Application Priority Data

Dec. 13, 2017 (JP) .............................. JP2017-238552

(51) Int. Cl.
*H01L 51/00* (2006.01)
*H01L 51/05* (2006.01)
(Continued)

(52) U.S. Cl.
CPC ........ *H01L 51/0018* (2013.01); *G03F 7/0045* (2013.01); *G03F 7/162* (2013.01);
(Continued)

(58) Field of Classification Search
CPC ............. H01L 51/0018; H01L 51/0097; H01L 51/0545; H01L 51/055; H01L 51/105; H01L 51/0021; H01L 51/0558
See application file for complete search history.

(56) References Cited

U.S. PATENT DOCUMENTS

2002/0146647 A1* 10/2002 Aoki ................. H01L 21/02063
430/311
2016/0152642 A1* 6/2016 Yamaguchi ............... G03F 7/20
548/542
(Continued)

FOREIGN PATENT DOCUMENTS

JP 2008-50321 A 3/2008

OTHER PUBLICATIONS

International Search Report dated Feb. 19, 2019 in International Patent Application No. PCT/JP2018/045417.
(Continued)

*Primary Examiner* — Omar F Mojaddedi
(74) *Attorney, Agent, or Firm* — Staas & Halsey LLP

(57) ABSTRACT

What is provided is a pattern forming method for forming a pattern on a surface to be processed of an object, the method including: a first layer forming step of forming a first layer containing a compound having a protective group that is decomposable by an acid and also decomposable by light, on the surface to be processed; a second layer forming step of forming a second layer containing a photoacid generator that is configured to generate an acid by exposure, on the first layer; an exposure step of exposing the first layer and the second layer to form a latent image including an exposed region and an unexposed region, on the first layer; and a disposition step of disposing a pattern forming material in the exposed region or the unexposed region.

31 Claims, 3 Drawing Sheets

(51) Int. Cl.
  *H01L 51/10*   (2006.01)
  *G03F 7/00*    (2006.01)
  *G03F 7/16*    (2006.01)
  *G03F 7/20*    (2006.01)
  *G03F 7/004*   (2006.01)

(52) U.S. Cl.
  CPC ............ *G03F 7/168* (2013.01); *G03F 7/2004* (2013.01); *H01L 51/0097* (2013.01); *H01L 51/055* (2013.01); *H01L 51/0545* (2013.01); *H01L 51/105* (2013.01)

(56) References Cited

U.S. PATENT DOCUMENTS

| | | | |
|---|---|---|---|
| 2018/0335698 A1* | 11/2018 | Nakajima | ............. G03F 7/2004 |
| 2019/0040207 A1* | 2/2019 | Shigaki | ............... H01L 21/0274 |
| 2019/0292403 A1* | 9/2019 | Yaguchi | ................ H01L 21/027 |

OTHER PUBLICATIONS

Written Opinion dated Feb. 19, 2019 in International Patent Application No. PCT/JP2018/045417.

\* cited by examiner (a)

(b)

(c)

(d)

(e)

PATTERN FORMING METHOD, METHOD FOR PRODUCING TRANSISTOR, AND MEMBER FOR PATTERN FORMATION

CROSS-REFERENCE TO RELATED APPLICATIONS

This application is a Continuation Application, under 35 U.S.C. § 111 (a), of International Patent Application No. PCT/JP2018/045417, filed on Dec. 11, 2018, which claims foreign priority benefit under 35 U.S.C. § 119 of Japanese Patent Application No. 2017-238552 filed on Dec. 13, 2017 in the Japanese Intellectual Property Office, the contents of both of which are incorporated herein by reference.

TECHNICAL FIELD

The present invention relates to a pattern forming method, a method for producing a transistor, and a member for pattern formation.

BACKGROUND ART

In recent years, in producing of micro-devices such as devices for semiconductor devices, integrated circuits, organic EL displays, and the like, a method in which patterns each having different surface characteristic are formed on a substrate and the micro-device is manufactured using the difference between the surface characteristics has been proposed.

As a pattern forming method using a difference in surface characteristics on a substrate, for example, there is a method in which a hydrophilic region and a water-repellent region are formed on a substrate, and an aqueous solution of a functional material is applied to the hydrophilic region. In this method, since the aqueous solution of the functional material wets and spreads in only the hydrophilic region, a thin film pattern of the functional material can be formed.

In recent years, as a material capable of forming the hydrophilic region and the water-repellent region on the substrate, a coupling agent is used. Patent Document 1 describes a photodegradable coupling agent capable of significantly changing a contact angle before and after light irradiation. Such a photodegradable coupling agent preferably has excellent sensitivity to light.

CITATION LIST

Patent Literature

[Patent Document 1]
Japanese Unexamined Patent Application, First Publication No. 2008-50321

Summary of Invention

A first aspect of the present invention is a pattern forming method for forming a pattern on a surface to be processed of an object, the method including: a first layer forming step of forming a first layer containing a compound having a protective group that is decomposable by an acid and also decomposable by light, on the surface to be processed; a second layer forming step of forming a second layer containing a photoacid generator that is configured to generate an acid by exposure, on the first layer; an exposure step of exposing the first layer through the second layer to form a latent image including an exposed region and an unexposed region, on the first layer; and a disposition step of disposing a pattern forming material in the exposed region or the unexposed region.

A second aspect of the present invention is a method for producing a transistor, the method including a step of forming at least one electrode of a gate electrode, a source electrode, and a drain electrode by the pattern forming method according to the first aspect.

A third aspect of the present invention is a pattern forming method for forming a pattern on a surface to be processed of an object, the method including: a first layer forming step of forming a first layer containing a compound having a protective group that is decomposable by an acid and also decomposable by light, on the surface to be processed; a second layer forming step of forming a second layer containing a photoacid generator that is configured to generate an acid by exposure, on the first layer; an exposure step of exposing the first layer and the second layer to form a latent image including an exposed region and an unexposed region, on the first layer; and an electroless plating step of disposing a catalyst for electroless plating in the exposed region or the unexposed region to perform electroless plating.

A fourth aspect of the present invention is a method for producing a transistor, the method including a step of forming at least one electrode of a gate electrode, a source electrode, and a drain electrode by the pattern forming method according to the third aspect.

A fifth aspect of the present invention is a member for pattern formation, including: a predetermined substrate; a first layer provided on the substrate; and a second layer provided on the first layer, in which the first layer contains a compound having a protective group that is decomposable by an acid and also decomposable by light, and the second layer contains a photoacid generator that is configured to generate an acid by exposure.

DESCRIPTION OF EMBODIMENTS

<Pattern Forming Method>

Figure 1:
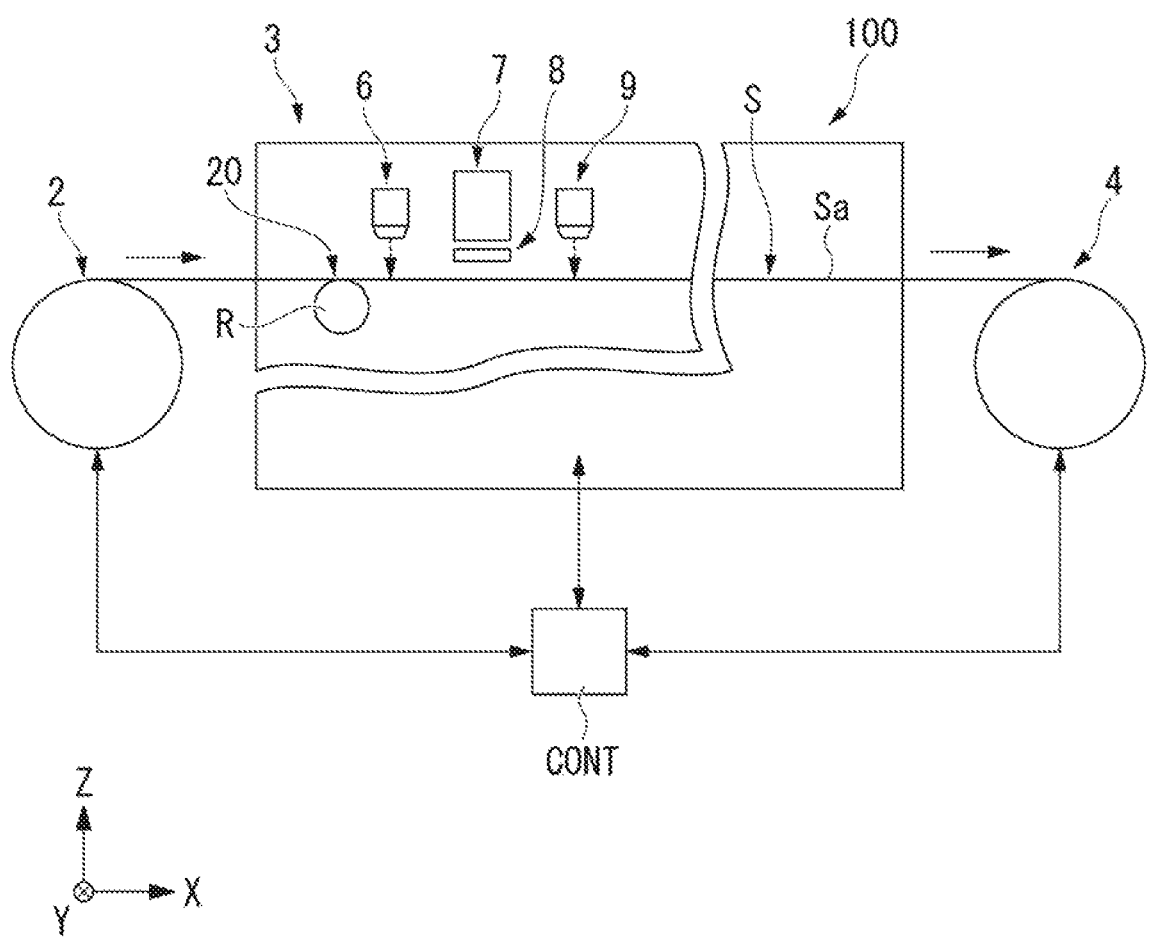
FIG. 1 is a schematic diagram showing an overall configuration of a substrate processing apparatus suitable for a pattern forming method according to the present embodiment.

A pattern forming method of the present embodiment includes a step of forming a second layer containing a photoacid generator on a first layer containing a compound having a protective group that is decomposable by an acid and also decomposable by light and further exposing the layer selectively.

In the compound used in the present embodiment, a group that exhibits water repellency is decomposed (eliminated) by exposure, and a group that exhibits hydrophilicity is generated. Therefore, a surface to be processed of an object can be changed from water-repellent to hydrophilic by an action of exposure. In the present specification, in a case where the compound has a protective group, it is defined as having water repellency. In addition, in a case where the protective group is decomposed (eliminated) and a static water contact angle is relatively smaller than that in a case of having the protective group, it is defined as having a hydrophilicity.

In the present embodiment, in addition to this, the second layer containing the photoacid generator is formed on the first layer. When the second layer is selectively exposed to light, an acid is generated in an exposed area, the protective group of the compound contained in the first layer is eliminated by the action of the acid, and a hydrophilic group such as an amino group is generated.

According to the pattern forming method of the present embodiment, since an exposed portion of the first layer can be changed from water-repellent to hydrophilic by the action of the acid in addition to the action of light, exposure amount can be reduced, step time for an exposure step can be shortened, and high productivity can be realized.

Hereinafter, preferred embodiments of the pattern forming method of the present invention will be described.

First Embodiment

The present embodiment is a pattern forming method for forming a pattern on a surface to be processed of an object, the method including: a first layer forming step of forming a first layer containing a compound having a protective group that is decomposable by an acid and also decomposable by light, on the surface to be processed; a second layer forming step of forming a second layer containing a photoacid generator that generates an acid by exposure, on the first layer; an exposure step in which the first layer is exposed through the second layer and the protective group of the compound contained in the first layer is decomposed, thereby changing the exposed area of the first layer from water-repellant to hydrophilic to form a latent image including a hydrophilic region and a water-repellent region; and a disposition step of disposing a pattern forming material in the hydrophilic region and the water-repellent region.

[First Layer Forming Step]

In the pattern forming method for forming a pattern on a surface to be processed of an object, the present step is a step of forming the first layer containing the compound having a protective group that is decomposable by an acid and also decomposable by light, on the surface to be processed.

The object is not particularly limited. In the present embodiment, examples of a material of the object include metal, crystalline materials (for example, single crystalline, polycrystalline, and partially crystalline materials), amorphous materials, a conductor, a semiconductor, an insulator, a fiber, glass, ceramics, zeolite, plastic, and thermosetting and thermoplastic materials (for example, polyacrylates, polycarbonates, polyurethanes, polystyrenes, cellulosic polymers, polyolefins, polyamides, polyimides, polyesters, polyphenylenes, polyethylenes, polyethylene terephthalates, polypropylenes, ethylene vinyl copolymers, and polyvinyl chloride, which are optionally doped). In addition, the object may be an optical element, a coated substrate, a film, and the like, and these may have flexibility.

Here, the term "flexibility" means a property that even when applying a force of about own weight of a substrate to the substrate, the substrate can be bent without breaking or fracture. In addition, a property of bending by a force of about own weight is also included in the flexibility. In addition, the flexibility varies depending on a material, a size, a thickness, environment such as temperature, and the like of the substrate. As the substrate, a band-shaped single substrate may be used. The substrate can be configured such that a plurality of unit substrates are connected to form a band.

In the present step, it is preferable to chemically modify an entire surface of the surface to be processed of the object or a specific region with a compound to be described later.

A method for chemically modifying the surface to be processed of the object is not particularly limited as long as in the method, X in General Formula (1) to be described later, which is bound to reactive Si is bound to the substrate, and known method such as a dipping method and a chemical processing method can be used.

<<Compound>>

The compound used in the present embodiment is preferably a fluorine-containing compound represented by General Formula (1) below.

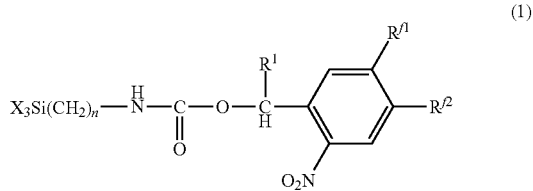

(1)

[In General Formula (1), X represents a halogen atom or an alkoxy group, $R^1$ represents a hydrogen atom or a linear, branched, or cyclic alkyl group having 1 to 10 carbon atoms, $R^{f1}$ and $R^{f2}$ are each independently an alkoxy group, a siloxy group, or a fluorinated alkoxy group, and n represents an integer of 0 or more.]

In General Formula (1) above, X is a halogen atom or an alkoxy group. Examples of the halogen atom represented by X include a fluorine atom, a chlorine atom, a bromine atom, and an iodine atom. X is more preferably an alkoxy group rather than the halogen atom. n represents an integer and is preferably an integer of 1 to 20 and more preferably an integer of 2 to 15 from a viewpoint of easy availability of a starting material.

In General Formula (1), $R^1$ is a hydrogen atom or a linear, branched, or cyclic alkyl group having 1 to 10 carbon atoms.

The alkyl group of $R^1$ is preferably a linear or branched alkyl group having 1 to 5 carbon atoms. Specific examples thereof include a methyl group, an ethyl group, a propyl group, an isopropyl group, an n-butyl group, an isobutyl group, a tert-butyl group, a pentyl group, an isopentyl group, and a neopentyl group.

Examples of the cyclic alkyl group include groups obtained by removing one or more hydrogen atoms from polycycloalkane such as monocycloalkane, bicycloalkane, tricycloalkane, and tetracycloalkane.

In the present embodiment, $R^1$ is preferably a hydrogen atom, a methyl group, or an ethyl group.

In General Formula (1), $R^{f1}$ and $R^{f2}$ are each independently an alkoxy group, a siloxy group, or a fluorinated alkoxy group.

In General Formula (1), the alkoxy group, the siloxy group, or the fluorinated alkoxy group of $R^{f1}$ or $R^{f2}$ is preferably an alkoxy group having 3 or more carbon atoms, which may be partially fluorinated or may be a perfluoroalkoxy group. In the present embodiment, the fluorinated alkoxy group which is partially fluorinated is preferable.

In the present embodiment, examples of the fluorinated alkoxy group of $R^{f1}$ or $R^{f2}$ include a group represented by —O—$(CH_2)_{n^{f1}}$—$(C_{n^{f2}}F_{2n^{f2}+1})$. $n^{f1}$ is an integer of 0 or more, and $n^{f2}$ is an integer of 0 or more.

In the present embodiment, $n^{f1}$ is preferably 0 to 30, more preferably 0 to 15, and particularly preferably 0 to 5.

In addition, in the present embodiment, $n'^2$ is preferably 0 to 30, more preferably 0 to 15, and particularly preferably 1 to 5.

In General Formula (1), n is an integer of 0 or more. In the present embodiment, n is preferably 3 or more, and more preferably 4 or more.

Specific examples of the fluorine-containing compound represented by General Formula (1) are shown below.

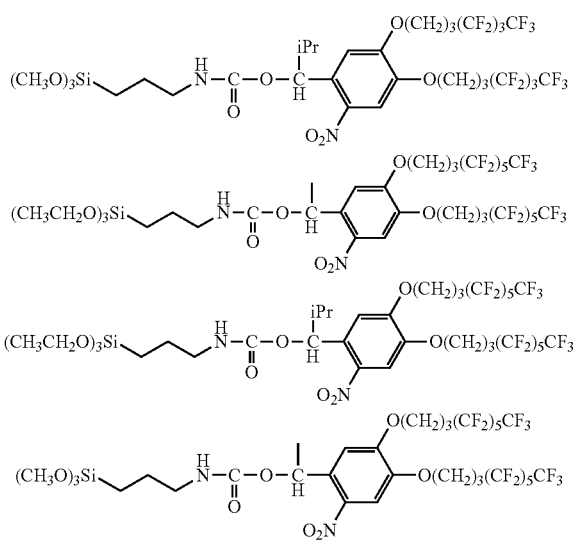

The fluorine-containing compound can be produced by a method disclosed in PCT International Publication No. WO 2015/029981.

An example of chemical modification in the present step is shown below. In the following formula, descriptions for X, $R^1$, $R'^1$, $R'^2$, and n are the same as those of $R^1$, $R'^1$, $R'^2$, and n in General Formula (1).

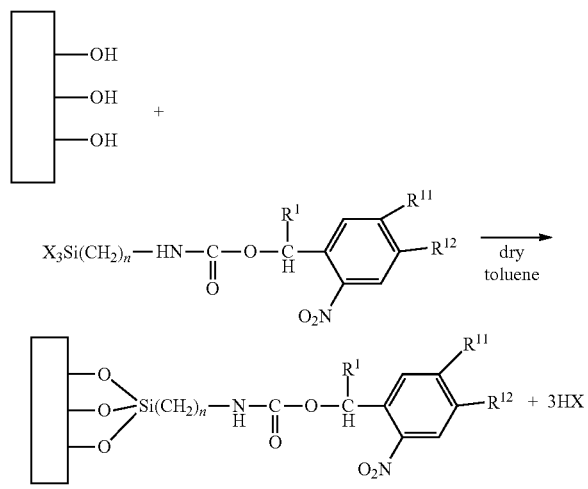

[Second Layer Forming Step]

The present step is a step of forming a second layer containing a photoacid generator that generates an acid by exposure, on the first layer. The photoacid generator used in the present embodiment is preferably a photocationic acid generator.

Specific examples of the photocationic acid generator include an onium compound, a sulfone compound, a sulfonate compound, a sulfonimide compound, a disulfonyldiazomethane compound, a disulfonylmethane compound, an oxime sulfonate compound, and a hydrazine sulfonate compound. Examples of the onium compound include a sulfonium salt-based photocationic acid generator, an iodonium salt-based photocationic acid generator, and a diazonium salt-based photocationic acid generator.

Examples of the sulfonium salt-based photocationic acid generator include triarylsulfonium salts such as triphenylsulfonium hexafluorophosphate, triphenylsulfonium hexafluoroantimonate, triphenylsulfonium tetrakis(pentafluorophenyl) borate, diphenyl-4-(phenylthio) phenylsulfonium hexafluorophosphate, diphenyl-4-(phenylthio) phenylsulfonium hexafluoroantimonate, 4,4'-bis[diphenylsulfonio] diphenyl sulfide bishexafluorophosphate, 4,4'-bis[di(β-hydroxyethoxy) phenylsulfonio] diphenyl sulfide bishexafluoroantimonate, 4,4'-bis[di(β-hydroxyethoxy) phenylsulfonio] diphenyl sulfide bishexafluorophosphate, 7-[di (p-toluyl) sulfonio]-2-isopropylthioxanthone hexafluoroantimonate, 7-[di(p-toluyl) sulfonio]-2-isopropylthioxanthone tetrakis(pentafluorophenyl) borate, 4-phenylcarbonyl-4'-diphenylsulfonio-diphenyl sulfide hexafluorophosphate, 4-(p-tert-butylphenylcarbonyl)-4'-diphenylsulfonio-diphenyl sulfide hexafluoroantimonate, and 4-(p-tert-butylphenylcarbonyl)-4'-di(p-toluyl) sulfonio-diphenyl sulfide tetrakis(pentafluorophenyl) borate.

Examples of the iodonium salt-based photocationic acid generator include diaryliodonium salts such as diphenyliodonium tetrakis (pentafluorophenyl) borate diphenyliodonium hexafluorophosphate, diphenyliodonium hexafluoroantimonate, di(4-t-butylphenyl) iodonium hexafluorophosphate, di(4-t-butylphenyl) iodonium hexafluoroantimonate, trilylcumyliodonium tetrakis (pentafluorophenyl) borate, (4-methylphenyl)[4-(2-methylpropyl) phenyl]-hexafluorophosphate, di(4-nonylphenyl) iodonium hexafluorophosphate, and di(4-alkylphenyl) iodonium hexafluorophosphate.

Examples of the diazonium salt-based photocationic acid generator include benzenediazonium hexafluoroantimonate, and benzenediazonium hexafluorophosphate.

As the photoacid generator, a commercially available product can be used. Examples thereof include ADEKA OPTOMER SP-100, SP-150, SP-152, SP-170, and SP-172 [manufactured by ADEKA Corporation], Photoinitiator 2074 (manufactured by Rhodia), KAYARAD PCI-220 and PCI-620 [manufactured by Nippon Kayaku Co., Ltd.], IRGACURE 250 [manufactured by Ciba Japan K.K.], CPI-100P, CPI-110P, CPI-101A, CPI-200K, and CPI-210S (manufactured by San-Apro Ltd.), WPI-113 and WPI-116 [manufactured by Wako Pure Chemical Corporation]), and BBI-102, BBI-103, TPS-102, TPS-103, DTS-102, and DTS-103 [manufactured by Midori Kagaku Co., Ltd.].

In the present step, for the photoacid generator, in order to obtain favorable application property, it is preferable that a photoacid generator composition containing a resin component and a solvent component is prepared and the photoacid generator composition is applied to form the second layer.

Specific examples of the resin component include polycarboxylic acid esters such as polyurethane and polyacrylate. It is possible to obtain favorable acid accessibility of the resin component to an interface, by using a resin component having a high proton diffusion coefficient. For example, those having a proton diffusion distance of 20 to 2000 nm in the resin component may be used, and those having the proton diffusion distance of 50 to 100 nm may also be used.

When using the resin component whose diffusion distance increases depending on a step temperature, photoresponsivity can be improved by post-exposure heating step to be described later.

Examples of the solvent component include water; alcohols such as methanol, ethanol, propanol, isopropanol, and butanol; ketones such as acetone, methyl ethyl ketone (MEK), and methyl isobutyl ketone (MIBK); aromatic hydrocarbons such as benzene, toluene, xylene, and ethylbenzene; ethers such as diethyl ether, dimethoxyethane, tetrahydrofuran, and dioxane; esters such as methyl acetate, ethyl acetate, isopropyl acetate, and butyl acetate; amides such as N,N-dimethylformamide and N,N-dimethylacetamide; and nitriles such as acetonitrile, propionitrile, and benzonitrile. One kind of these can be used alone, and two or more kinds thereof can be used in combination (that is, as a mixed solvent). Among these, the alcohols and the ketones are preferable.

In the present embodiment, a content of an acid generator in the photoacid generator composition is preferably 2 parts by mass or more and 10 parts by mass or less, and more preferably 3 parts by mass or more and 8 parts by mass or less, and particularly preferably 3.5 parts by mass or more and 6.5 parts by mass or less, with respect to 100 parts by mass of the resin component.

When setting the content of the photoacid generator within the ranges, the application property of the photoacid generator composition becomes favorable. Furthermore, the acid can sufficiently reach the first layer.

[Exposure Step]

The present step is a step in which the surface to be processed in which the first layer and the second layer are formed is irradiated with light having a predetermined pattern to be exposed selectively, and a latent image including a hydrophilic region and a water-repellent region is formed. According to the present step, in the compound of the exposed area, a group having water repellency (protective group) is eliminated to generate a group having hydrophilicity, and the hydrophilic region is formed. In the unexposed area, this elimination does not occur and the water-repellent region remains as it is.

Since the group having water-repellent property is dissociated and a residue (an amino group) having hydrophilic property is generated, the latent image including the hydrophilic region and the water-repellent region can be formed after the irradiation with light.

Furthermore, in the exposed area of the second layer, an acid is generated, and the acid diffused in the first layer eliminates the water-repellent group of the compound. Therefore, in the exposed area, the elimination of the water-repellent group of the compound further progresses.

In the present step, the light used for irradiation is preferably ultraviolet light. The light used for irradiation preferably includes light having a wavelength in a range of 200 to 450 nm, and more preferably includes light having a wavelength in the range of 320 to 450 nm. In addition, it is also preferable to perform irradiation with light including light having a wavelength of 365 nm. The light having these wavelengths can efficiently decompose the protective group of the compound used in the present embodiment. Examples of light source include a low-pressure mercury lamp, a high-pressure mercury lamp, an ultra-high-pressure mercury lamp, a xenon lamp, and a sodium lamp; and gas laser using nitrogen or the like, liquid laser using an organic dye solution, and solid laser containing rare-earth ions in an inorganic single crystal.

In addition, as the light source other than the laser with which monochromatic light is obtained, light having a specific wavelength obtained by extracting a broadband line spectrum or continuous spectrum using an optical filter such as a bandpass filter or a cutoff filter may be used. From a point that a large area can be irradiated at a time, a high-pressure mercury lamp or an ultra-high-pressure mercury lamp is preferable as the light source.

In the pattern forming method of the present embodiment, irradiation can be performed with predetermined light in the range above, and it is particularly preferable to perform the irradiation with light energy having a distribution corresponding to a circuit pattern.

The exposure step is not particularly limited. The exposure may be performed once or a plurality of times. In addition, in a case where a transparent object is processed, the exposure may be performed from the object side or the exposure may be performed from the second layer side. From a viewpoint that the exposure step can be more shortened, the exposure is preferably performed once.

In addition, in the present embodiment, exposure of the first layer and the second layer may be performed at the same time, the exposure of the first layer may be performed first, and the exposure of the second layer may be performed later. The exposure of the second layer may be performed first, and the exposure of the first layer may be performed later.

An example of the step in which the chemically modified surface to be processed is irradiated with the light having a predetermined pattern to dissociate the group having water-repellent property and a residue (amino group) having hydrophilic property is generated will be shown. In the following formula, descriptions for $R^1$, $R^{f1}$, $R^{f2}$, and n are the same as those of $R^1$, $R^{f1}$, $R^{f2}$, and n in General Formula (1) above.

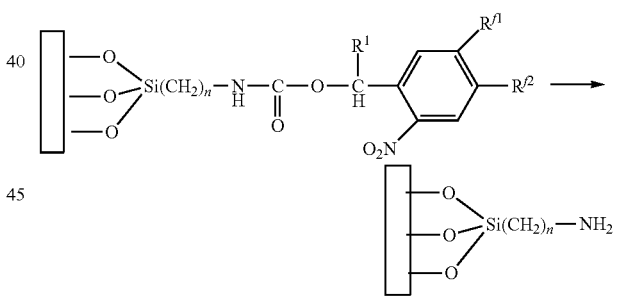

[Optional Post-Exposure Heating Step]

In the present embodiment, heating may be performed after the exposure step. Examples of a method for heating include an oven, a hot plate, and an infrared heater. A heating temperature may be 40° C. to 200° C., or may be 50° C. to 120° C.

[Optional Cleaning Step]

In the present embodiment, the second layer may be removed by cleaning after the exposure step or after the optional post-exposure heating step. In a disposition step to be described later, in a case where a conductive material is disposed, the second layer is preferably removed by cleaning.

[Disposition Step]

The present step is a step of disposing the pattern forming material in the hydrophilic region or the water-repellent region formed in the exposure step.

Examples of the pattern forming material include a wiring material (metal solution) in which particles of gold, silver, copper or alloys of these are dispersed in a predetermined solvent, an electronic material in which a precursor solution containing the metal described above, an insulator (resin), a semiconductor, an organic EL light-emitting material, and the like are dispersed in a predetermined solvent, and a resist liquid.

In the pattern forming method of the aspect of the present embodiment, the pattern forming material is preferably a liquid conductive material, a liquid semiconductor material, or a liquid insulating material.

Examples of the liquid conductive material include a pattern forming material formed of a dispersion liquid in which conductive fine particles are dispersed in a dispersion medium. As the conductive fine particles, for example, in addition to metal fine particles containing any one of gold, silver, copper, palladium, nickel, and ITO, oxides thereof, and fine particles of a conductive polymer or a superconductor are used.

These conductive fine particles can be used by coating the surface with an organic substance or the like in order to improve dispersibility.

The dispersion medium is not particularly limited as long as it can disperse the conductive fine particles described above and does not cause aggregation. For example, in addition to the water, alcohols such as methanol, ethanol, propanol, and butanol; hydrocarbon compounds such as n-heptane, n-octane, decane, dodecane, tetradecane, toluene, xylene, cymene, durene, indene, dipentene, tetrahydronaphthalene, decahydronaphthalene, and cyclohexylbenzene; ether-based compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl) ether, and p-dioxane; and polar compounds such as propylene carbonate, γ-butyrolactone, N-methyl-2-pyrrolidone, dimethylformamide, dimethylsulfoxide, and cyclohexanone are exemplary examples. Among these, from points that dispersibility of fine particles, stability of dispersion liquid, and ease of application to a droplet discharge method (ink jet method), water, alcohols, hydrocarbon compounds, and ether-based compounds are preferable, and examples of a more preferable dispersion medium can include water and hydrocarbon compounds.

As the liquid semiconductor material, an organic semiconductor material dispersed or dissolved in a dispersion medium can be used. As the organic semiconductor material, a π-electron conjugated polymer material whose skeleton is formed of conjugated double bonds is desirable. Typically, examples thereof include a soluble polymer material such as polythiophene, poly(3-alkylthiophene), a polythiophene derivative, and pentacene.

Examples of the liquid insulating material include an insulating material obtained by dispersing or dissolving polyimide, polyamide, polyester, acryl, phosphorus glass (PSG), borophosphosilicate glass (BPSG), polysilazane-based SOG, silicate-based SOG (spin on glass), alkoxysilicate-based SOG, and $SiO_2$ having Si—$CH_3$ bond represented by siloxane polymer, in the dispersion medium.

In the present step, as a method for disposing the pattern forming material, a droplet discharge method, an ink jet method, a spin coating method, a roll coating method, and a slot coating method can be applied.

<<Circuit Pattern Forming Method for Electronic Device>>

In the pattern forming method of the present embodiment, the pattern can be a circuit pattern for an electronic device.

As the substrate, the above-described object can be used. However, in a case where the circuit pattern for the electronic device is formed by a substrate processing apparatus 100 to be described later, the object is preferably a resin substrate having flexibility.

A shape of the substrate is not particularly limited, and a flat surface, a curved surface, or a flat surface partially having a curved surface is preferable, and the flat surface is more preferable. In addition, an area of a base material is not particularly limited, and it is possible to adopt a base material having a surface as large as a conventional application method can be adopted. In addition, the first layer is preferably formed on one surface of the base material on the flat surface.

When forming the first layer on the surface of the substrate, it is preferable to preprocess the surface of the substrate. As a preprocessing method, preprocessing with a piranha solution, or preprocessing using UV-ozone cleaner or plasma cleaner is preferable.

A method for forming the first layer on the surface of the substrate is not particularly limited as long as in the method, X in General Formula (1) above, which is bound to reactive Si is bound to the substrate, and known method such as a dipping method and a chemical processing method can be used.

Hereinafter, the pattern forming method of the present embodiment will be described with reference to the drawings.

In the pattern forming method of the present embodiment, in a case where a flexible substrate corresponding to a so-called roll-to-roll process is used, the pattern may be formed by using the substrate processing apparatus 100 which is a roll-to-roll apparatus as shown in FIG. 1.

As illustrated in FIG. 1, the substrate processing apparatus 10) includes a substrate feeding unit 2 that feeds a band-shaped substrate (for example, a band-shaped film member) S; substrate processing unit 3 that performs processing on a surface (a surface to be processed) Sa of the substrate S; a substrate recovery unit 4 that recovers the substrate S; an application unit 6 of fluorine-containing compound; an exposure unit 7; a mask 8, a pattern material application unit 9; and a control unit CONT that controls these units. The substrate processing unit 3 can execute various processing on the surface of the substrate S after the substrate S is sent out from the substrate feeding unit 2 and before the substrate S is recovered by the substrate recovery unit 4.

The substrate processing apparatus 100 can be suitably used, for example, in a case where a display element (electronic device) such as an organic EL element or a liquid crystal display element is formed on the substrate S.

Although FIG. 1 illustrates a method using a photomask to generate a desired pattern light, the present embodiment can be suitably applied to a maskless exposure method without using the photomask. Examples of the maskless exposure method for generating the pattern light without using the photomask include a method using a spatial light modulator such as DMD and a method of scanning with a spot light like a laser beam printer.

In the pattern forming method of the present embodiment, an XYZ coordinate system is set as shown in FIG. 1, and the following description will be made using the XYZ coordinate system as appropriate. In the XYZ coordinate system, for example, an X axis and a Y axis are set along a horizontal plane, and a Z axis is set upward along a vertical direction.

In addition, the substrate processing apparatus 100 transports the substrate S from a minus side (−side) to a plus side (+side) along the X axis as a whole. In this case, the width direction (short direction) of the band-shaped substrate S is set in the Y-axis direction.

As the substrate S which is to be processed in the substrate processing apparatus 100, for example, a foil of a resin film, stainless steel, or the like can be used. For example, for the resin film, a material such as polyethylene resin, polypropylene resin, polyester resin, ethylene vinyl copolymer resin, polyvinyl chloride resin, cellulose resin, polyamide resin, polyimide resin, polycarbonate resin, polystyrene resin, and vinyl acetate resin can be used.

It is preferable that the substrate S has a small coefficient of thermal expansion such that a dimension thereof does not change even when receiving heat of about 200° C., for example. For example, the dimensional change can be suppressed by annealing the film. In addition, it is possible to make the coefficient of thermal expansion small by mixing an inorganic filler with the resin film. Examples of the inorganic filler include titanium oxide, zinc oxide, alumina, and silicon oxide. In addition, the substrate S may be a single piece of ultra-thin glass having a thickness of about 100 μm produced by a float method or the like, or may be a laminate obtained by pasting the resin film or an aluminum foil to the ultra-thin glass.

The dimension in the width direction (short direction) of the substrate S is, for example, formed to be about 1 m to 2 m, and the dimension in the length direction (long direction) is, for example, formed to be 10 m or larger. Of course, this dimension is merely an example, and is not limited thereto. For example, the dimension of the substrate S in the Y direction may be 50 cm or smaller, or may be 2 m or larger. In addition, the dimension of the substrate S in the X direction may be 10 m or smaller.

The substrate S is preferably formed to have flexibility. Here, the term "flexibility" means a property that even when applying a force of about own weight of a substrate to the substrate, the substrate can be bent without breaking or fracture. In addition, a property of bending by a force of about own weight is also included in the flexibility.

In addition, the flexibility varies depending on a material, a size, a thickness, environment such as temperature, and the like of the substrate. As the substrate S, a band-shaped single substrate may be used. The substrate may be configured such that a plurality of unit substrates are connected to form a band.

The substrate feeding unit 2 sends out and feeds the substrate S, for example, wound in a roll shape to the substrate processing unit 3. In this case, the substrate feeding unit 2 is provided with a shaft part around which the substrate S is wound, a rotation driving device for rotating the shaft part, and the like. In addition, for example, a configuration in which a cover part or the like that covers the substrate S in a state of being wound in a roll shape may be adopted. The substrate feeding unit 2 is not limited to a mechanism that sends out the substrate S wound in a roll shape, and may be any unit as long as the substrate feeding unit 2 includes a mechanism (for example, a nip-type driving roller) that sequentially sends out the band-shaped substrate S in a length direction thereof.

The substrate recovery unit 4 recovers the substrate S that has passed through the substrate processing apparatus 100, for example, by winding into a roll. Similar to the substrate feeding unit 2, the substrate recovery unit 4 is provided with a shaft part for winding the substrate S, a rotation driving source for rotating the shaft part, a cover part for covering the recovered substrate S, and the like. In a case where the substrate S is cut into a panel shape in the substrate processing unit 3, a configuration in which the substrate S is recovered in a state different from the state of being wound in a roll shape may be adopted. For example, the substrate S is recovered in a stacked state.

The substrate processing unit 3 transports the substrate S fed from the substrate feeding unit 2 to the substrate recovery unit 4, and performs a step of forming the first layer on a surface Sa to be processed of the substrate S during the transport, a step of forming the second layer on the first layer, a step of performing irradiation with light with predetermined pattern, and a step of disposing the pattern forming material. The substrate processing unit 3 includes an application unit 6 that applies a material for forming the first layer and the second layer to the surface Sa to be processed of the substrate S, the exposure unit 7 that performs irradiating with light, a mask 8, a pattern material application unit 9, and a transporting device 20 including a driving roller R for feeding the substrate S under the condition corresponding to a processing mode.

Examples of the application unit 6 and the pattern material application unit 9 include a droplet application device (for example, a droplet discharge application device, an ink jet application device, a spin coating application device, a roll coating application device, and a slot coating application device).

Each device of these is appropriately provided along the transport path of the substrate S, and a panel or the like of a flexible display can be produced by a so-called roll-to-roll method. In the present embodiment, it is assumed that the exposure unit 7 is provided, and a device for performing steps before and after the step (such as photosensitive layer forming step and photosensitive layer developing step) is provided inline as necessary.

According to the pattern forming method of the present embodiment, with respect to the compound contained in the first layer, elimination of the protective group by exposure and elimination of the protective group by the action of the acid generated from the photoacid generator proceed. Therefore, the protective group of the fluorine compound in the exposed area can be eliminated with a small exposure amount.

According to the pattern forming method of the present embodiment, since the photoresponsivity is improved, even in a case of using a fluorine compound having a protective group containing a nitrobenzyl structure, which requires an exposure amount of several joules or more for decomposition, the protective group can be eliminated with a small exposure amount.

<Pattern Forming Method by Electroless Plating>

The present embodiment is a pattern forming method for forming a pattern on a surface to be processed of an object, the method including: a first layer forming step of forming a first layer containing a compound having a protective group that is decomposable by an acid and also decomposable by light, on the surface to be processed; a second layer forming step of forming a second layer containing a photoacid generator that generates an acid by exposure, on the first layer; an exposure step in which the first layer is exposed through the second layer and the protective group of the compound contained in the first layer is decomposed, thereby changing the exposed area of the first layer from water-repellant to hydrophilic to form a latent image including a hydrophilic region and a water-repellent region; and an electroless plating step of disposing a catalyst for electroless plating in the hydrophilic region and the water-repellent region to perform electroless plating.

According to the present embodiment, for example, a wiring pattern can be formed by electroless plating using the following method. Hereinafter, a description will be given with reference to FIG. 2.

(First Step)

First, as shown in FIG. 2(a), a first layer containing a compound having a protective group that is decomposable by an acid and also decomposable by light is on the surface of a substrate 11 and a second layer containing a photoacid generator that generates an acid by exposure is formed on the first layer. In FIG. 2(a), a compound layer 12 is a compound layer including the first layer and the second layer.

As an application method, any of general film forming techniques such as physical vapor deposition (PVD), chemical vapor deposition (CVD), and liquid phase growth method may be used. Among these, the liquid phase growth method is particularly preferable. Examples of the liquid phase growth method include an application method (spin coating, dip coating, die coating, spray coating, roll coating, and brush coating), and a printing method (flexographic printing and screen printing). In addition, a SAM film or an LB film may be used.

In the present step, processing of drying a solvent by, for example, heat or reduced pressure may be added.

(Second Step)

Next, as shown in FIG. 2(b), a photomask 13 having an exposed region having a predetermined pattern is prepared. An exposure method is not limited to a method using the photomask. As the exposure method, a method such as projection exposure using optical systems such as lenses and mirrors and maskless exposure using spatial light modulator, laser beam, or the like can be used. The photomask 13 may be provided so as to be in contact with the compound layer 12 or may be provided so as not to be in contact with the compound layer 12.

(Third Step)

Thereafter, as shown in FIG. 2(c), the compound layer 12 is irradiated with UV light through the photomask 13. Accordingly, the compound layer 12 is exposed in the exposed region of the photomask 13 and a hydrophilic region 14 is formed.

The irradiation can be performed with the UV light having a wavelength at which the optimum quantum efficiency is exhibited by the structure of the photosensitive group. For example, an i-ray at 365 nm is an exemplary example. In addition, the exposure amount and the exposure time do not necessarily need to completely proceed with deprotection, and may satisfy an extent that deprotection partially occurs. In this case, in the plating step to be described later, conditions (such as activity of the plating bath) according to the degree of progress of deprotection can be appropriately changed.

(Fourth Step)

Next, as shown in FIG. 2(d), a catalyst for electroless plating is applied to the surface to form a catalyst layer 15. The catalyst for electroless plating is a catalyst that reduces metal ions contained in a plating solution for electroless plating, and examples thereof include silver and palladium.

The amino group is exposed on the surface of the hydrophilic region 14, and the amino group can capture and reduce the above-described catalyst for electroless plating. Therefore, the catalyst for electroless plating is captured only on the hydrophilic region 14, and the catalyst layer 15 is formed. In addition, as the catalyst for electroless plating, a catalyst capable of supporting a hydrophilic group such as an amino group generated by decomposition of the protective group can be used.

(Fifth Step)

As shown in FIG. 2(e), an electroless plating processing is performed to form a plating layer 16. Examples of a material of the plating layer 16 include nickel-phosphorus (NiP) and copper (Cu).

In the present step, the substrate 11 is immersed in an electroless plating bath to reduce metal ions on the catalyst surface, thereby depositing the plating layer 16. In this case, since the catalyst layer 15 supporting a sufficient amount of the catalyst is formed on the surface of the hydrophilic region 14, the plating layer 16 can be selectively deposited only on the hydrophilic region 14. In a case where the reduction is insufficient, the substrate may be immersed in a reducing agent solution such as sodium hypophosphite or sodium borohydride to actively reduce the metal ions on the amine.

<Method for Producing a Transistor>

Figure 3:
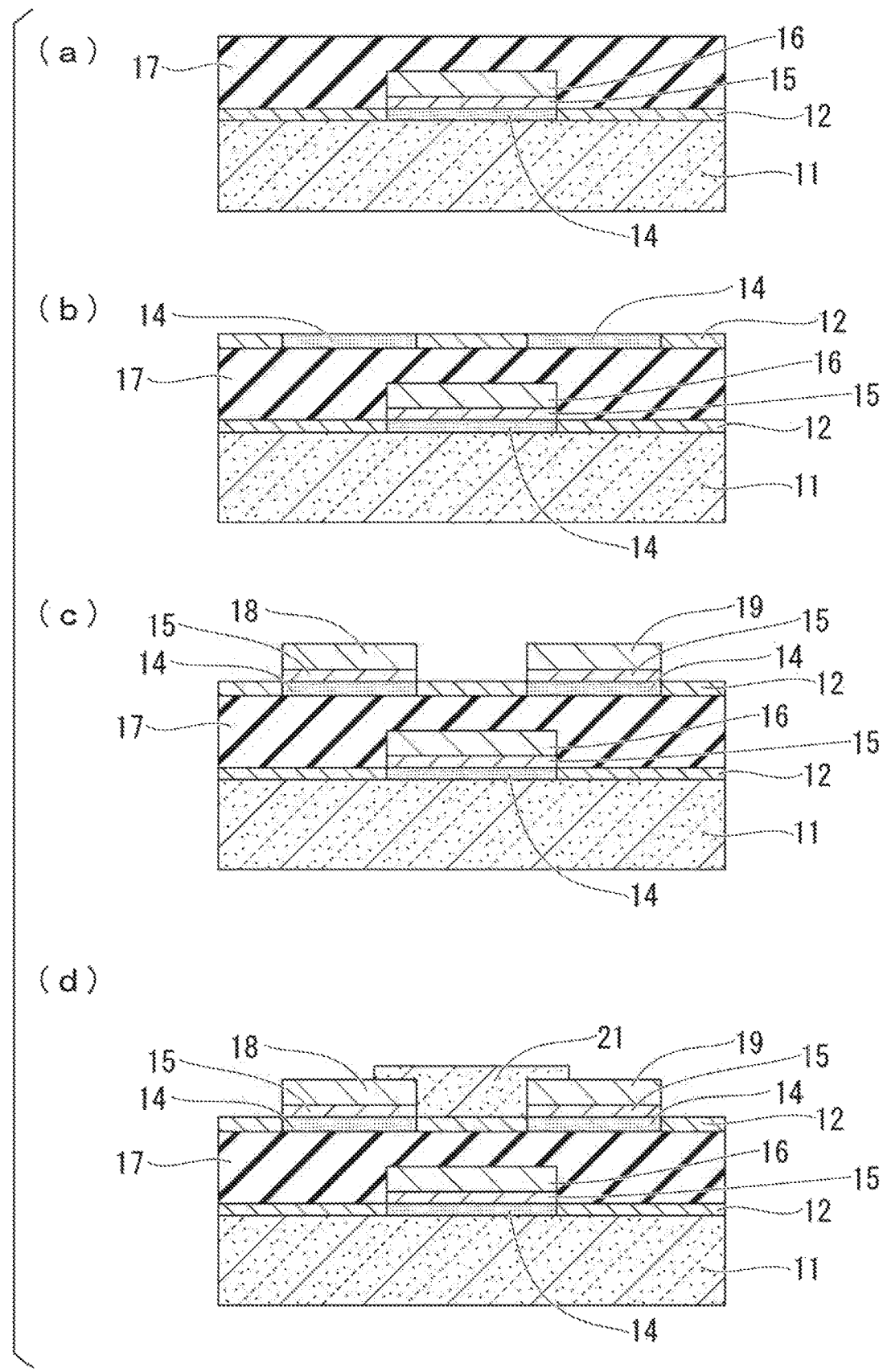
FIG. 3 is a diagram showing an example of a schematic step of a method for producing a transistor.

Furthermore, a method for producing a transistor using the plating layer 16 obtained in the fifth step as a gate electrode will be described with reference to FIG. 3.

(Sixth Step)

As shown in FIG. 3(a), an insulating layer 17 is formed on the compound layer 12 by covering the plating layer 16 with the electroless plating pattern formed by the above-described electroless plating pattern forming method by a known method. The insulating layer 17 may be formed in a manner that, for example, an application solution obtained by dissolving one or more resins of an ultraviolet-curable acrylic resin, an epoxy resin, an en-thiol resin, a silicone resin, and the like in an organic solvent is used and the application solution is applied. When irradiating the coated film with ultraviolet light through a mask provided with an opening corresponding to a region where the insulating layer 17 is formed, the insulating layer 17 can be formed in a desired pattern.

(Seventh Step)

As shown in FIG. 3(b), the hydrophilic region 14 is formed in a portion where a source electrode and a drain electrode are formed, in the same manner as in the first to third steps of the above-described electroless plating pattern forming method.

(Eighth Step)

As shown in FIG. 3(c), the catalyst for electroless plating is supported on the hydrophilic region 14 to form the catalyst layer 15 in the same manner as in the fourth and fifth steps of the above-described electroless plating pattern forming method. Thereafter, a plating layer 18 (source electrode) and a plating layer 19 (drain electrode) are formed by performing electroless plating. Examples of a material of the plating layers 18 and 19 also include nickel-phosphorus (NiP) and copper (Cu), and the plating layers 18 and 19 may be formed of a material different from that of the plating layer 16 (gate electrode).

(Ninth Step)

As shown in FIG. 3(d), a semiconductor layer 21 is formed between the plating layer 18 (source electrode) and the plating layer 19 (drain electrode). The semiconductor layer 21 may be formed in a manner that, for example, a solution in which an organic semiconductor material soluble in an organic solvent such as TIPS pentacene (6,13-Bis (triisopropyl silylethynyl) pentacene) is dissolved in the organic solvent is prepared, and the solution is applied between the plating layer 18 (source electrode) and the plating layer 19 (drain electrode) and dried. Before forming the semiconductor layer 21, the compound layer 12 between the plating layer 18 (source electrode) and the plating layer 19 (drain electrode) may be exposed to have hydrophilicity. By making the portion corresponding to a channel of the transistor hydrophilic, the solution is suitably applied to the hydrophilic portion, and the semiconductor layer 21 is easy to be selectively formed. In addition, the semiconductor layer 21 may be formed in a manner that one or more kinds of insulating polymer such as polystyrene (PS) or polymethyl methacrylate (PMMA) is added to the solution, and the solution containing the insulating polymer is applied and dried. When the semiconductor layer 21 is formed in this manner, the insulating polymer is concentrated and formed below the semiconductor layer 21 (on the insulating layer 17 side). In a case where a polar group such as an amino group is present at the interface between the organic semiconductor and the insulating layer, transistor characteristics tend to deteriorate. However, when adopting a configuration in which the organic semiconductor is provided through the insulating polymer, the deterioration in transistor characteristics can be suppressed. As described above, a transistor can be produced.

Figure 2:
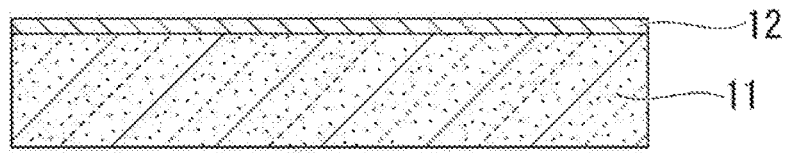
FIG. 2 is a diagram showing a schematic step of the pattern forming method.
Figure 2:
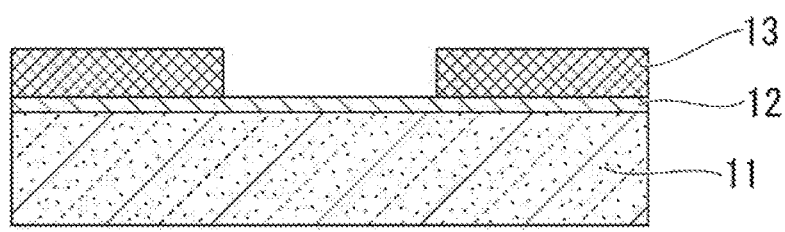
Figure 2:
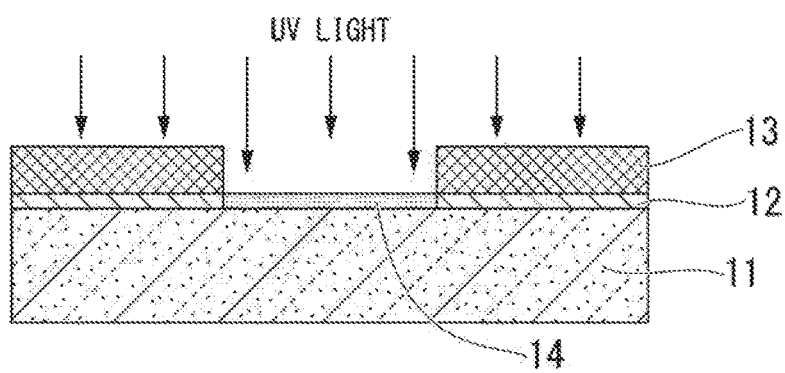
Figure 2:
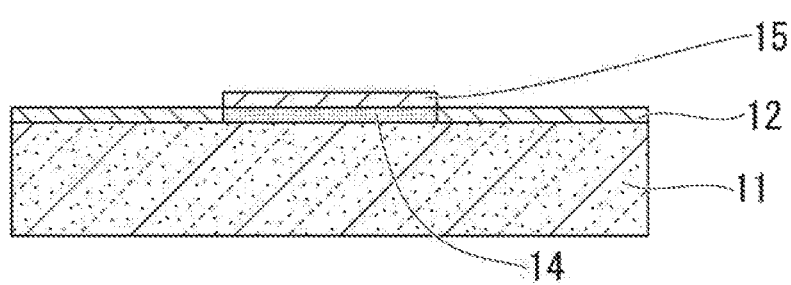
Figure 2:
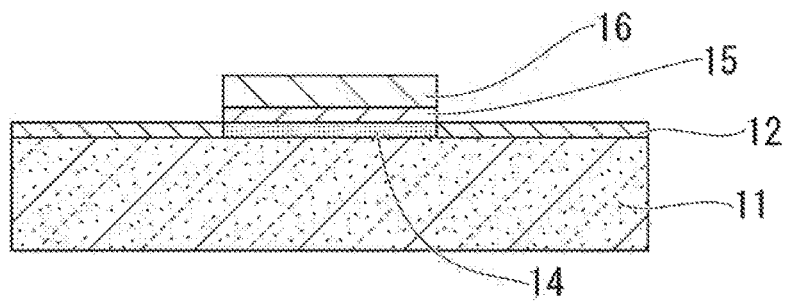

A structure of the transistor is not particularly limited and can be appropriately selected depending on the purpose. In aspects of FIGS. 2 and 3, a method for producing a bottom-contact and bottom-gate type transistor has been described. However, top-contact and bottom-gate type, top-contact and top gate type, and bottom-contact and top-gate type transistors may also be produced in the same manner. In the aspects of FIGS. 2 and 3, a method of forming all of the gate electrode, the source electrode, and the drain electrode using the compound of the first embodiment has been described. However, only the gate electrode may be formed using the compound of the first embodiment, and only the source electrode and the drain electrode may be formed using the compound of the first embodiment.

<Member for Pattern Formation>

The present embodiment is a member for pattern formation, including: a predetermined substrate; a first layer provided on the substrate; and a second layer provided on the first layer, in which the first layer contains a compound having a protective group that is decomposable by an acid and also decomposable by light, and the second layer contains a photoacid generator that generates an acid by exposure.

A substrate for pattern formation of the present embodiment includes a first layer containing a compound having a protective group that is decomposable by an acid and is also decomposable by light, and a second layer containing a photoacid generator that generates an acid by exposure, on the surface of the substrate in order. Therefore, by selectively exposing the layers through a mask or the like, in the exposed area, the group exhibiting water repellency is decomposed (eliminated), and the group exhibiting hydrophilicity is generated. In the present embodiment, in addition to this, the second layer containing the photoacid generator is provided on the first layer. When the second layer is selectively exposed to light, an acid is generated in an exposed area, the protective group of the compound contained in the first layer is eliminated by the action of the acid, and a hydrophilic group such as an amino group is generated.

According to the member for pattern formation of the present embodiment, it is possible to form a desired pattern including the hydrophilic region and the water-repellent region by the selective exposure.

In the member for pattern formation of the present embodiment, the compound of the first layer, the compound having a protective group that is decomposable by the acid and also decomposable by light is preferably a compound that generates an amino group by decomposition of the protective group.

In the member for pattern formation of the present embodiment, the compound of the first layer, the compound having a protective group that is decomposable by the acid and also decomposable by light is preferably a fluorine-containing compound represented by General Formula (1).

In the member for pattern formation of the present embodiment, the substrate to be used preferably includes a resin material. As the resin material that can be preferably used, the same resin material as the resin material of the substrate described in the pattern forming method of the present invention can be used.

In the member for pattern formation of the present embodiment, the substrate to be used preferably has flexibility.

EXAMPLES

Hereinafter, the present invention will be described more specifically with reference to examples, but the present invention is not limited to the following examples.

Example 1

[First Layer Forming Step]
Substrate Cleaning Step

A polyethylene terephthalate substrate having a film thickness of 125 nm (Cosmoshine A4100, manufactured by Toyobo) on which SiOx was deposited was cut (5 cm×5 cm), immersed in a cleaning container containing 100 ml of isopropyl alcohol, and ultrasonically cleaned at 28 kHz for 1 minute. Furthermore, the substrate was dried with a nitrogen flow, and then cleaned with an atmospheric pressure plasma device.

Preparation of Fluorine Compound-Containing Composition 0.2 mass % hexafluoroxylene solution of Compound (F1) below was prepared to obtain a fluorine compound-containing composition. The Compound (F1) below was produced by a method described in PCT International Publication No. WO 2015/029981.

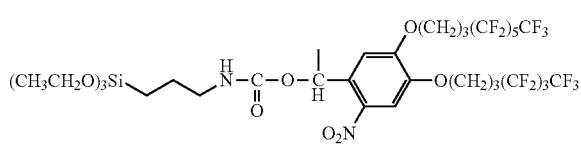

(F1)

Application Step

The cleaned substrate was spin-coated with the fluorine compound-containing composition (at 3000 rpm for 30 seconds), and heated at 100° C. using an oven for 10 minutes and dried.

[Second Layer Forming Step]
Preparation of Photoacid Generator-Containing Composition The photoacid generator (CPI-210S, manufactured by San-Apro Ltd.) was added using an alcohol solution (Raspack, manufactured by Audec Corporation) having a polyurethane concentration of 20 mass % so as to be 1 mass % (1 mass % with respect to polyurethane). Stirring was performed using a self-revolving kneading machine. Further, irradiation with 28 kHz ultrasonic waves was performed for 5 minutes to complete dissolution. Furthermore, a polyurethane concentration was adjusted to 5 mass % using isopropanol.

Formation of Photoacid Generator-Containing Layer

The substrate which was subjected to photosensitive surface processing was spin-coated with a photoacid generator-containing composition (at 1000 rpm for 30 seconds), and heated at 90° C. for 1 minute using a hot plate and dried.

[Exposure Step]

Exposure was performed with 365 nm UV light. The exposure was performed by changing the exposure amount to 0 mJ/cm$^2$, 100 mJ/cm$^2$, 300 mJ/cm$^2$, 500 mJ/cm$^2$, 1000 mJ/cm$^2$, 2000 mJ/cm$^2$, or 4000 mJ/cm$^2$, for each substrate.

After the exposure, the substrate was immersed in a cleaning container containing 100 ml of isopropyl alcohol and ultrasonically cleaned at 28 kHz for 1 minute. The substrate was rinsed with the isopropyl alcohol, and then subjected to nitrogen flow, and heated at 90° C. for 1 minute to be dried.

Using a contact angle meter (DMe211, manufactured by Kyowa Interface Science Co., Ltd.), the static water contact angle (liquid amount 1 ul) of the substrate which was exposed at each exposure amount was measured. Results are shown in Table 1 below.

Example 2

After [Exposure step], heating was performed at 50° C. for 1 minute using a hot plate. After heating, the substrate was cleaned and the static water contact angle was measured. Results are shown in Table 1 below.

Comparative Example 1

Except that [Photoacid generator-containing layer forming step] was not performed, steps until the exposure step were performed in the same manner as in Example 1, and the static water contact angle (liquid amount 1 ul) of the substrate which was exposed at each exposure amount was measured.

Results are shown in Table 1 below.

TABLE 1

| | Exposure amount (mJ/cm$^2$) | | | | | | |
|---|---|---|---|---|---|---|---|
| | 0 | 100 | 300 | 500 | 1000 | 2000 | 4000 |
| Contact angle (°) of Example 1 | 119.1 | 101.8 | 72.3 | 66.9 | 62.4 | 59.8 | 60.1 |
| Contact angle (°) of Example 2 | 106 | 74.8 | 58.2 | 53.2 | 51.4 | 50.4 | 48.1 |
| Contact angle (°) of Comparative Example 1 | 118.8 | 110.2 | 90.8 | 81.7 | 66.4 | 56.8 | 58 |

As shown in the results, in Examples 1 and 2, even when the exposure amount was as low as 100 mJ/cm$^2$ or 300 mJ/cm$^2$, the static water contact angle could be greatly reduced as compared with Comparative Example 1, and photoresponsivity was improved.

For example, when the exposure amount required to lower the contact angle from the unexposed state by 30° is calculated, the required exposure amount is 344 mJ/cm$^2$ in Comparative Example 1, but 186 mJ/cm$^2$ in Example 1. It was confirmed that the photoresponsivity improving effect was approximately doubled. In addition, in Example 2, the exposure amount required to lower the contact angle by 30° was 96 mJ/cm$^2$, and it was confirmed that the photoresponsivity effect was about 4 times that of Comparative Example 1.

REFERENCE SIGNS LIST

S Substrate
CONT Control unit
Sa Surface to be processed
2 Substrate feeding unit
3 Substrate processing unit
4 Substrate recovery unit
6 Fluorine-containing compound application unit
7 Exposure unit
8 Mask
9 Pattern material application unit
100 Substrate processing apparatus

What is claimed is:

1. A pattern forming method for forming a pattern on a surface to be processed of an object, the method comprising:
   forming a first layer containing a compound having a protective group that is decomposable by an acid and also decomposable by light, on the surface to be processed;
   forming a second layer containing a photoacid generator that is configured to generate an acid by exposure, on the first layer;
   exposing the first layer and the second layer to form a latent image including an exposed region and an unexposed region, on the first layer; and
   disposing a pattern forming material in the exposed region or the unexposed region.

2. The pattern forming method according to claim 1, wherein the exposed region is relatively hydrophilic as compared with the unexposed region.

3. The pattern forming method according to claim 1, wherein the pattern is a circuit pattern for an electronic device.

4. The pattern forming method according to claim 1, wherein in the exposing, the first layer is exposed through the second layer.

5. The pattern forming method according to claim 1, wherein in the exposing, the second layer is exposed through the first layer.

6. The pattern forming method according to claim 1, wherein in the disposing, the pattern forming material is disposed in the exposed region.

7. The pattern forming method according to claim 1, wherein in the compound, an amino group is generated by decomposition of the protective group.

8. The pattern forming method according to claim 1, wherein the compound is a fluorine-containing compound represented by General Formula (1),

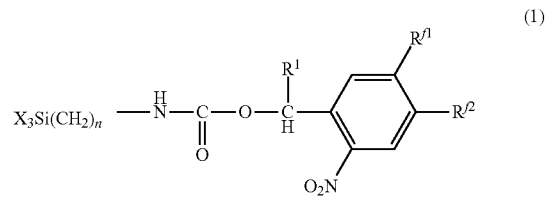

[in General Formula (1), X represents a halogen atom or an alkoxy group, R¹ represents a hydrogen atom or a linear, branched, or cyclic alkyl group having 1 to 10 carbon atoms, $R^{f1}$ and $R^{f2}$ are each independently an alkoxy group, a siloxy group, or a fluorinated alkoxy group, and n represents an integer of 0 or more].

9. The pattern forming method according to claim 1, wherein the pattern forming material includes a liquid conductive material, a liquid semiconductor material, or a liquid insulating material.

10. The pattern forming method according to claim 1, wherein light for the exposure includes light having a wavelength in a range of 200 nm to 450 nm.

11. The pattern forming method according to claim 1, wherein the object is a substrate formed of a resin material.

12. The pattern forming method according to claim 1, wherein the object is a substrate having flexibility.

13. A method for producing a transistor including a gate electrode, a source electrode, and a drain electrode, the method comprising:
forming at least one electrode of the gate electrode, the source electrode, and the drain electrode by the pattern forming method according to any one of claims 1.

14. A pattern forming method for forming a pattern on a surface to be processed of an object, the method comprising:
forming a first layer containing a compound having a protective group that is decomposable by an acid and also decomposable by light, on the surface to be processed;
forming a second layer containing a photoacid generator that is configured to generate an acid by exposure, on the first layer;
exposing the first layer and the second layer to form a latent image including an exposed region and an unexposed region, on the first layer; and
electroless plating of disposing a catalyst for electroless plating in the exposed region or the unexposed region to perform electroless plating.

15. The pattern forming method according to claim 14, wherein the exposed region is relatively hydrophilic as compared with the unexposed region.

16. The pattern forming method according to claim 14, wherein the pattern is a circuit pattern for an electronic device.

17. The pattern forming method according to claim 14, wherein in the exposing, the first layer is exposed through the second layer.

18. The pattern forming method according to claim 14, wherein in the exposing, the second layer is exposed through the first layer.

19. The pattern forming method according to claim 14, wherein in the electroless plating, the catalyst for electroless plating is disposed in the exposed region.

20. The pattern forming method according to claim 14, wherein in the compound, an amino group is generated by decomposition of the protective group.

21. The pattern forming method according to claim 14, wherein the compound is a fluorine-containing compound represented by General Formula (1),

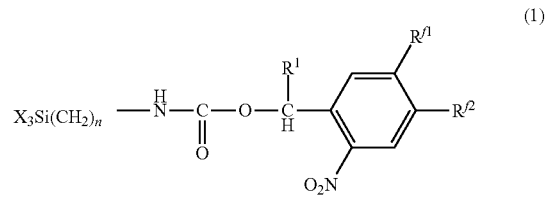

[in General Formula (1), X represents a halogen atom or an alkoxy group, R¹ represents a hydrogen atom or a linear, branched, or cyclic alkyl group having 1 to 10 carbon atoms, $R^{f1}$ and $R^{f2}$ are each independently an alkoxy group, a siloxy group, or a fluorinated alkoxy group, and n represents an integer of 0 or more].

22. The pattern forming method according to claim 14, wherein the catalyst for electroless plating is palladium.

23. The pattern forming method according to claim 14, wherein light for the exposure includes light having a wavelength in a range of 200 nm to 450 nm.

24. A method for producing a transistor including a gate electrode, a source electrode, and a drain electrode, the method comprising:
forming at least one electrode of the gate electrode, the source electrode, and the drain electrode by the pattern forming method according to claim 14.

25. The pattern forming method according to claim 14, wherein the object is a substrate formed of a resin material.

26. The pattern forming method according to claim 14, wherein the object is a substrate having flexibility.

27. A member for pattern formation, comprising:
a predetermined substrate;
a first layer provided on the substrate; and
a second layer provided on the first layer,
wherein the first layer contains a compound having a protective group that is decomposable by an acid and also decomposable by light, and
the second layer contains a photoacid generator that is configured to generate an acid by exposure.

28. The member for pattern formation according to claim 27, wherein in the compound, an amino group is generated by decomposition of the protective group.

29. The member for pattern formation according to claim 27, wherein the compound is a fluorine-containing compound represented by General Formula (1),

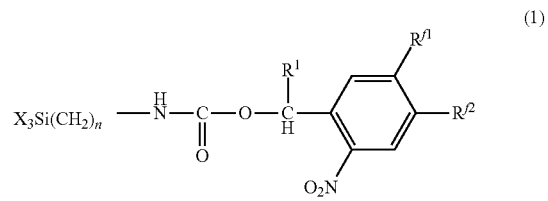

[in General Formula (1), X represents a halogen atom or an alkoxy group, R¹ represents a hydrogen atom or a linear, branched, or cyclic alkyl group having 1 to 10 carbon atoms, $R^{f1}$ and $R^{f2}$ are each independently an alkoxy group, a siloxy group, or a fluorinated alkoxy group, and n represents an integer of 0 or more].

30. The member for pattern formation according to claim 27,
wherein the substrate is formed of a resin material.

31. The member for pattern formation according to claim 27,
wherein the substrate has flexibility.

* * * * *

UNITED STATES PATENT AND TRADEMARK OFFICE
CERTIFICATE OF CORRECTION

PATENT NO. : 11,398,601 B2
APPLICATION NO. : 16/897728
DATED : July 26, 2022
INVENTOR(S) : Yusuke Kawakami It is certified that error appears in the above-identified patent and that said Letters Patent is hereby corrected as shown below:

In the Claims

Column 19, Line 26:
Claim 13, delete "any one of the claims" and insert --claim--.

Signed and Sealed this
Sixth Day of September, 2022

Katherine Kelly Vidal
*Director of the United States Patent and Trademark Office*